United States Patent
Hong

[11] Patent Number: 6,037,227
[45] Date of Patent: Mar. 14, 2000

[54] METHOD OF MAKING HIGH DENSITY MASK ROM HAVING A TWO LEVEL BIT LINE

[75] Inventor: Gary Hong, Hsin-Chu, Taiwan

[73] Assignee: United Microelectronics Corp., Taiwan

[21] Appl. No.: 08/950,719

[22] Filed: Oct. 15, 1997

Related U.S. Application Data

[60] Provisional application No. 60/048,403, Jun. 3, 1997.

[51] Int. Cl.[7] .................................................. H01L 21/8246
[52] U.S. Cl. .......................... 438/276; 438/282; 438/529
[58] Field of Search ...................................... 438/130, 275, 438/276, 277, 278, 282, 526, 529, 549

[56] References Cited

U.S. PATENT DOCUMENTS

| | | | |
|---|---|---|---|
| 4,649,629 | 3/1987 | Miller et al. .............................. | 438/130 |
| 4,717,684 | 1/1988 | Katto et al. ............................... | 438/275 |
| 5,470,774 | 11/1995 | Kunitou ................................... | 438/278 |
| 5,538,914 | 7/1996 | Chiu et al. ............................... | 438/275 |
| 5,670,402 | 9/1997 | Sogawa et al. .......................... | 438/275 |

*Primary Examiner*—Chandra Chaudhari
*Attorney, Agent, or Firm*—Rabin & Champagne, P.C.

[57] ABSTRACT

A mask ROM uses a bit line structure having a vertically graded dopant distribution or a distinct two level dopant distribution. A bit line might include a highly doped region buried deeply within the substrate that is connected to a comparatively lightly doped region formed above the more highly doped region. The vertical structure of the bit line allows the bit line to be less resistive than the simpler shallow bit line structure conventionally used. The vertical structure (i.e., the two level or graded structure) of the bit line allows the bit line to have a lower doping immediately adjacent the channel region, which reduces the likelihood of punchthrough. The deeper, highly doped portions of the bit line are narrow and laterally confined so that well defined antipunchthrough implantations can be formed which lie between but separated from the more highly doped portions of the bit lines. This aspect of the structure reduces the likelihood of punchthrough while limiting the extent of overlap between the buried bit lines and the antipunchthrough implantation.

22 Claims, 4 Drawing Sheets

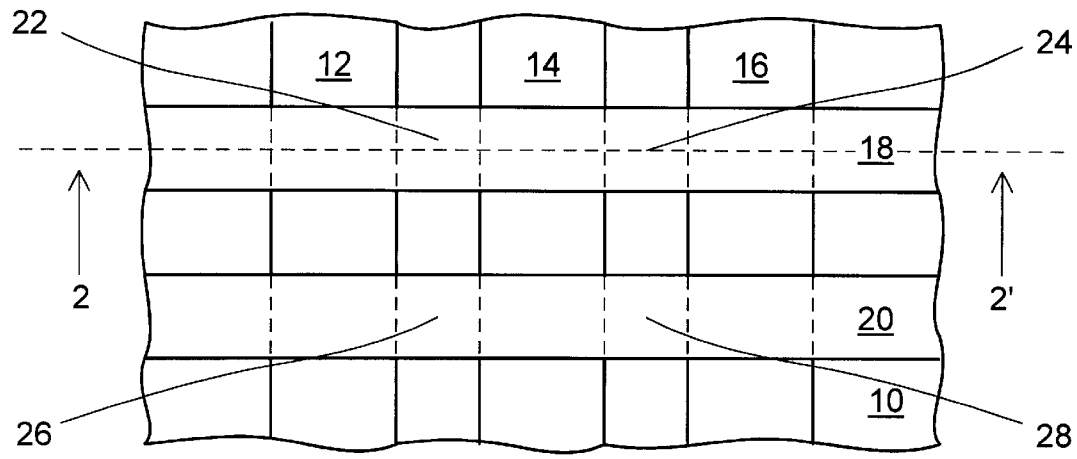
FIG. 1 - PRIOR ART
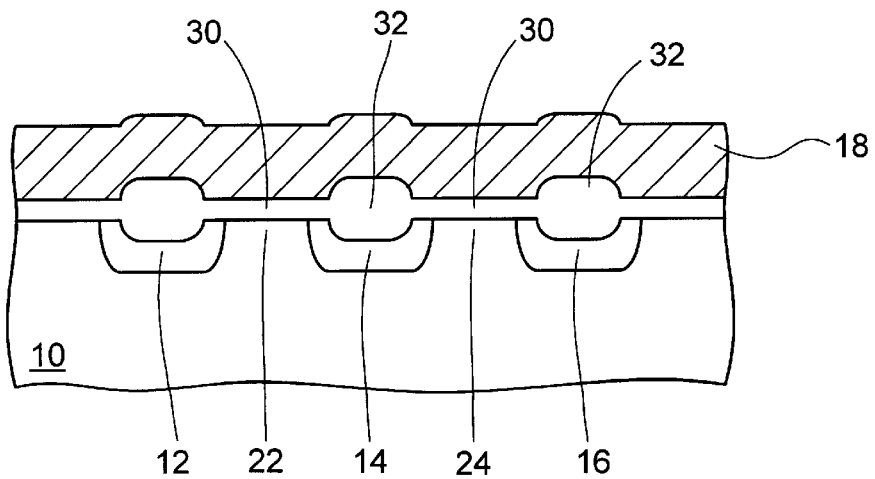
FIG. 2 - PRIOR ART

METHOD OF MAKING HIGH DENSITY MASK ROM HAVING A TWO LEVEL BIT LINE

This application claims priority from provisional application Ser. No. 60/048,403, filed Jun. 3, 1997.

BACKGROUND OF THE INVENTION

1. Field of the Invention

The present invention relates to methods for forming high density integrated circuit devices and to high density integrated circuit devices such as non-volatile memories formed by such methods.

2. Description of the Related Art

Certain integrated circuit memory devices consist of an array of memory cells positioned at the intersections between an array of parallel buried conducting lines formed in a semiconductor substrate and a perpendicular array of conductive wiring lines formed above the substrate. A prominent example of such memory devices is the type of read only memory (ROM) known as the mask ROM, although other memory devices including EEPROMs might have generally similar configurations. A small portion (four cells) of a mask ROM is illustrated in plan view FIG. 1 and a still smaller portion is illustrated in partial cross section in FIG. 2. The FIG. 1 mask ROM is formed on the P-type surface of a silicon substrate 10 and includes an array of buried bit lines 12, 14, 16 formed as N-type regions by selective doping of the substrate 10. An array of parallel polysilicon word lines 18, 20 extends over the surface of the substrate 10 in a direction generally perpendicular to the array of bit lines 12, 14, 16. The array of word lines is separated from the substrate by a layer of silicon oxide.

Most often, the ROM of FIG. 1 utilizes a shared bit line architecture. Thus, bit lines 12, 14, 16 act as source/drain regions for the memory field effect transistors (FETs), word lines 18, 20 act as the gates of the memory transistors, and regions 22, 24, 26, 28 in the substrate under the word lines and between adjacent bit lines act as the channel regions of the memory transistors. Information is stored in the individual memory transistors by altering the transport characteristics of the individual transistors in a manner that can be sensed using the appropriate pair of adjacent bit lines as source/drain contacts for the individual FET. One characteristic of the memory transistor that might be altered to store information is the transistor's threshold voltage. Consequently, the illustrated ROM may be programmed by selecting the threshold voltage of the various memory transistors of the array. The threshold voltages of each of the transistors of the array may be selected by ion implanting impurities through a code mask which ensures that the code implantation reaches only the channels of the FETs that are to have their threshold voltage altered. When programming of the mask ROM is accomplished using the selective implantation of dopants into the channels of the FETs, data stored at the memory locations can be read out by applying an appropriate signal to the particular word line that functions as the gate electrode for the transistor to select a row of memory transistors and then sensing the threshold voltage of the selected FET using the appropriate pair of adjacent bit lines as source/drain contacts for the FET.

FIG. 2 illustrates aspects of the structure of the ROM that are particularly related to the formation of the ROM. Typically, the array of buried bit lines is formed at an early stage in processing by forming an appropriate mask over the substrate and implanting N-type impurities into the substrate to define portions of the substrate that will become the conducting bit lines 12, 14, 16. The implanted substrate is then placed in a high temperature oxidizing environment to activate the bit line implantation and to grow an oxide layer over the surface of the substrate. The oxide layer consists of comparatively thin gate oxide layers 30 over the channel regions 22, 24 and thicker oxide layers 32 over the bit lines 12, 14, 16. Thicker oxide grows over the bit lines 12, 14, 16 because the heavily doped N-type silicon of the bit lines oxidizes at a much faster rate than does the more lightly doped P-type channel regions 22, 24. After the oxide layer is grown, a layer of doped polysilicon is provided over the oxide layer and patterned to define the gate electrodes of the memory transistors, such as the illustrated gate electrode 18. The gate electrodes also function as word lines for the ROM.

As the ROM illustrated in FIGS. 1 and 2 is made smaller, the width of the buried bit lines 12, 14, 16 becomes smaller and the spacing between the bit lines becomes smaller. Smaller bit lines are more resistive and so tend to reduce the speed at which data can be accessed from the ROM. More closely spaced bit lines have an increased likelihood of experiencing punchthrough at normal operating voltages. Punchthrough in FETs occurs when, for a given applied voltage, there are too few carriers in the channel region to maintain a distinct channel in the FET and the depletion region associated with the source and drain regions extends completely across the channel. For a FET after the onset of punchthrough, application of signals to the gate electrode effects little or no control on the FET. Punchthrough limits the maximum voltage that can be applied to short channel FETs and also limits how small a channel region can be made for certain combinations of source/drain and channel doping levels. As a practical matter, punchthrough limits how small memory transistors can be made in a high volume manufacturing environment. It is therefore desirable to produce a buried bit line structure more compatible with smaller device geometries so that reduced design rules do not result in unacceptable memory performance.

SUMMARY OF THE PREFERRED EMBODIMENTS

In accordance with one aspect of the invention, a memory device is formed on a substrate having a surface doping of a first conductivity type. An array of buried bit lines is formed in the substrate, the buried bit lines having a doping of a second conductivity type and a vertically graded dopant distribution, surface portions of the buried bit lines being more lightly doped than deeper portions of the buried bit lines, the surface portions of the buried bit lines defining channel regions therebetween. A gate oxide layer and array of word lines are formed over the substrate.

In another aspect of the invention, a memory device is formed on a substrate having a surface doping of a first conductivity type. A main bit line mask is formed over the substrate having main bit line openings. A first dosage of impurities of a second conductivity type is implanted into the main bit line openings to a first implantation depth to form first portions of an array of buried bit lines, the first portions of the buried bit lines defining channel regions therebetween. A narrow bit line mask is provided over the substrate having narrow openings smaller in width than the main bit line openings. A second dosage of impurities of the second conductivity type is provided into the narrow openings to a second implantation depth to form second portions of the array of buried bit lines, the second dosage being greater than the first dosage and the second implantation depth being greater than the first implantation depth. A gate oxide layer is provided over the substrate. An array of word lines is provided over the gate oxide layer extending generally perpendicular to the array of buried bit lines.

Another aspect of the invention provides a method of forming a memory device on a substrate having a surface doping of a first conductivity type. A first bit line mask is provided over the substrate having first bit line openings. A first dosage of impurities of a second conductivity type is implanted into the first bit line openings to a first implantation depth to form first portions of an array of buried bit lines, the first portions of the buried bit lines defining channel regions therebetween. A second bit line mask is provided over the substrate having second openings. A second dosage of impurities of the second conductivity type is implanted into the second openings to a second implantation depth to form second portions of the array of buried bit lines, the second dosage being greater than the first dosage and the second implantation depth being greater than the first implantation depth. An antipunchthrough implantation mask having antipunchthrough openings is provided over portions of the substrate so that edges of the antipunchthrough mask lie over portions of the substrate covered by the second bit line mask at a different step of the method. An antipunchthrough implantation of the first conductivity type is made below the channel regions and spaced from the second portions of the buried bit lines. A gate oxide layer is provided over the substrate. An array of word lines is provided over the gate oxide layer extending generally perpendicular to the array of buried bit lines.

BRIEF DESCRIPTION OF THE DRAWINGS

FIG. 1 is a plan view of a small portion of a conventional mask ROM.

FIG. 2 is a cross sectional view through a portion of the FIG. 1 mask ROM.

DETAILED DESCRIPTION OF THE PREFERRED EMBODIMENTS

Figure 3:
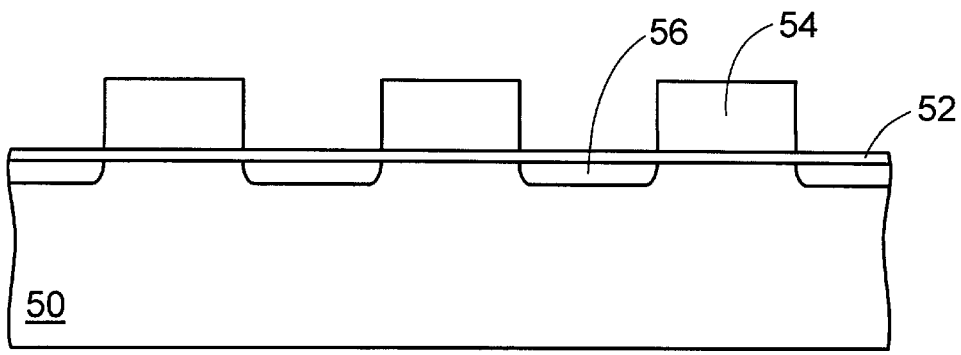
FIGS. 3–8 illustrate steps in the formation of a mask ROM in accordance with preferred embodiments of the present invention.

Preferred embodiments of the present invention provide integrated circuit memory devices of the type that utilize buried bit lines for accessing the memory array. Integrated circuit memory devices in accordance with the present invention may utilize a bit line structure having in the vertical direction a graded dopant distribution or a distinct two level dopant distribution. A bit line might include a highly doped region buried deeply within the substrate that is connected to a comparatively lightly doped region formed above the more highly doped region. The vertical extent of the bit line allows the bit line to be less resistive than the simpler shallow bit line structure conventionally used. The vertical structure (i.e., the two level or graded structure) of the bit line allows the bit line to have a lower doping level immediately adjacent the channel region, which reduces the likelihood of punchthrough.

In a further preferred aspect of some embodiments of the present invention, the deeper, highly doped portions of the bit lines are narrow and laterally confined. Well defined antipunchthrough implantations can then be made deep into the substrate so that the implantations lie between but separated from the more highly doped portions of the bit lines. This aspect of certain preferred embodiments further reduces the likelihood of punchthrough while limiting the extent of overlap between the buried bit lines and the antipunchthrough implantation. Overlap between the buried bit lines and the antipunchthrough implantation is undesirable because it increases the resistivity of the bit lines and increases the parasitic capacitance experienced by signals on the buried bit lines.

A particularly preferred aspect of the present invention provides a method of forming a memory which includes narrow buried bit lines with a graded or two level structure in the vertical direction. The preferred method begins with the formation of a main bit line mask which exposes the P-type surface of a substrate over where the buried bit lines will be formed. A light implantation of N-type dopants is made into a shallow region of the substrate which will become the more lightly doped surface portion of the buried bit line structure. Spacers are formed along the edges of the main bit line mask to form a narrowed bit line mask. The spacers are preferably formed of a material different from the main bit line mask. A heavier implantation of N-type dopants is made at a higher energy through the openings in the narrowed bit line mask to provide a greater quantity of dopants more deeply into the substrate which will become the more heavily doped deeper portions of the buried bit line structure. Processing may continue in particularly embodiments by next filling the openings in the narrowed bit line mask and removing the main bit line mask to uncover the channel regions between the bit lines. An antipunchthrough implantation is then made into the substrate to provide a relatively deep antipunchthrough implantation. The remaining mask materials are stripped from the substrate, a gate oxide layer is grown and polysilicon is deposited and patterned. Other processing is performed as desired to complete formation of the memory.

Manufacture of a memory in this manner provides a buried bit line structure that can be made smaller without the undesired increases in the bit line resistance and punchthrough susceptibility associated with the more conventional designs. In addition, because the gate oxide is formed on a substrate surface that does not have the same high level of N-type dopant as is used for forming the FIG. 2 oxide layer, a more planar oxide layer is grown in practicing the present invention to form a mask ROM. Better planarization of the oxide layer over the substrate of a mask ROM improves the processing margins for subsequent processing, including the process margins for forming the code mask and performing the code mask implantation to program (encode or personalize) the mask ROM. These and other aspects of the present invention are now described in further detail with reference to FIGS. 3–9.

FIG. 3 shows a mask ROM in accordance with preferred embodiments of the present invention at an early stage in the manufacturing process. Substrate 50 is preferably P-type silicon covered by a pad oxide layer 52 which protects the surface of the substrate during subsequent processing steps. The pad oxide layer 52 has a thickness sufficient to protect the surface of the substrate, for example, about 100–500 Å. Pad oxide layer 52 may be formed by chemical vapor deposition (CVD), but is often formed by thermal oxidation at the end of the preparation of the silicon wafer. A layer of silicon nitride is deposited over the surface of the substrate that will be patterned to form a main bit line mask. The layer of nitride is typically formed by CVD to a thickness of approximately 1000–2000 Å, taking into account the need for the layer to mask portions of the substrate during a high energy implantation process while limiting the thickness of the layer to optimize throughput. The layer of nitride is defined into a main bit line mask 54 using conventional photolithography, with openings in the main bit line mask 54 having a width corresponding to the limits of the photolithography process used. For purposes of illustrating this discussion, the openings in the main bit line will be assumed to be on the order of about 0.5 µm. The first, upper portions 56 of the bit lines are then formed by a shallow ion implantation of a relatively low level of impurities into the substrate through the openings in the main bit line mask 54. The first bit line implantation might, for example, consist of an implantation of arsenic impurities to a first dosage of approximately $1 \times 10^{14}/cm^2$ at an energy of approximately 30 KeV. Although phosphorus could be used in defining the bit lines, it is preferred that a heavier N-type dopant such as arsenic be used since such heavier dopants have a reduced mobility for diffusion in subsequent high temperature processing steps.

Figure 4:
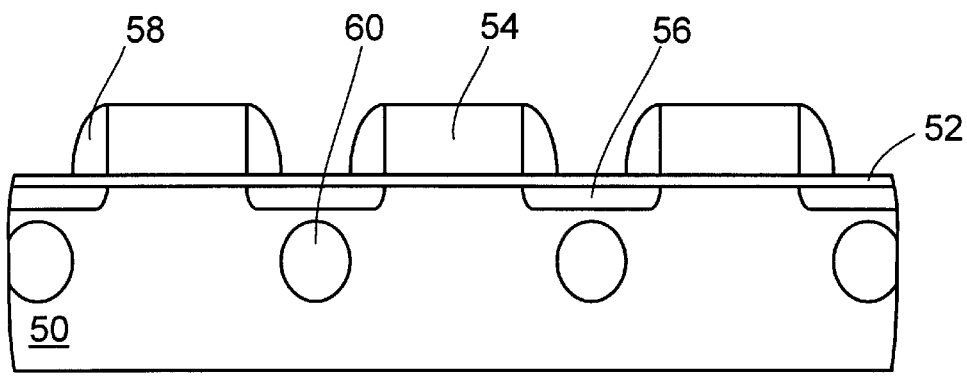

The second, deeper and more highly doped portions of the bit lines are now formed. First, a narrower mask is formed to define the implantation of the second portions of the bit lines. Most preferably, the second portions of the bit lines should be connected to, narrower than, and centered on the first, shallower and more lightly doped portions 56 of the bit lines. Thus, the narrow bit line mask is formed in a manner aligned to the main bit line mask, preferably by forming sidewall spacers 58 within the openings in the main bit line mask to define narrower openings that are centered on the openings in the main bit line mask, as shown in FIG. 4. Accordingly, a layer of a spacer material such as silicon oxide or polysilicon is deposited over the FIG. 3 device, typically in a CVD process. Because the spacers 58 are preferably defined in an anisotropic etch back process, the thickness of the silicon oxide or polysilicon spacer layer deposited will essentially determine the width of the spacers 58 formed within the openings in the main bit line mask 54. Thus, the thickness of the spacer layer deposited is selected to achieve the appropriate narrowing of the more deeply buried portions of the bit lines. For the illustrated example, the thickness of the spacer layer may be between about 500–1500 Å so that the narrowed openings defined by the separation between spacers 58 will be approximately 2000–4000 Å. It is preferred that the main bit line mask and the spacer layer be formed from different materials to facilitate the use of wet etching techniques to remove the main bit line mask without removing the spacers in a later processing stage. Such a wet etch removal process is facilitated by the materials identified above.

Spacers 58 are defined from the deposited spacer layer by anisotropically etching the spacer layer to at least expose the pad oxide layer. For oxide spacers an appropriate etchant might be derived in a plasma process from a $C_2F_6$ source gas and for polysilicon spacers an appropriate etchant might be derived in a plasma process from HCl and HBr source gases. The second portions 60 of the buried bit lines are then formed by implanting a second, higher concentration of impurities into the narrow openings between the spacers 58 to form the deeper portions of the buried bit lines. An appropriate implantation might include arsenic impurities implanted to a second dosage of approximately $1 \times 10^{15}/cm^2$ at an energy of approximately 200 KeV. This forms second portions 60 of the bit lines that will electrically contact the more lightly doped portions 56 of the bit lines. Most preferably, no activating anneal is performed yet.

Figure 5:
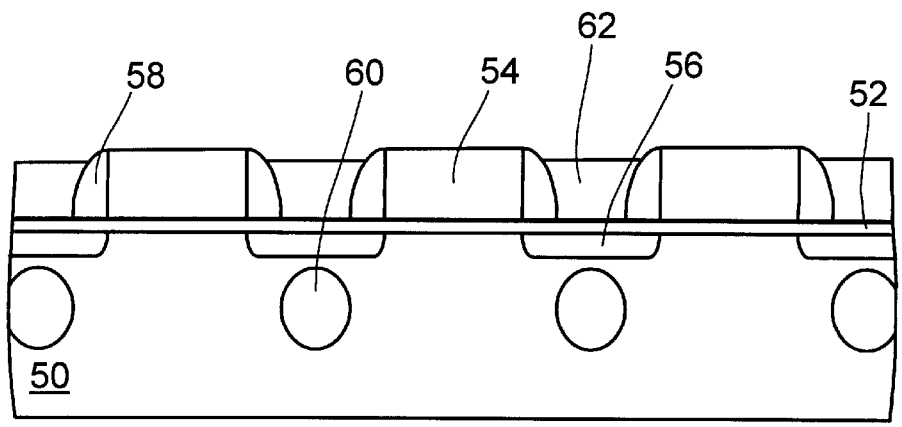
Figure 6:
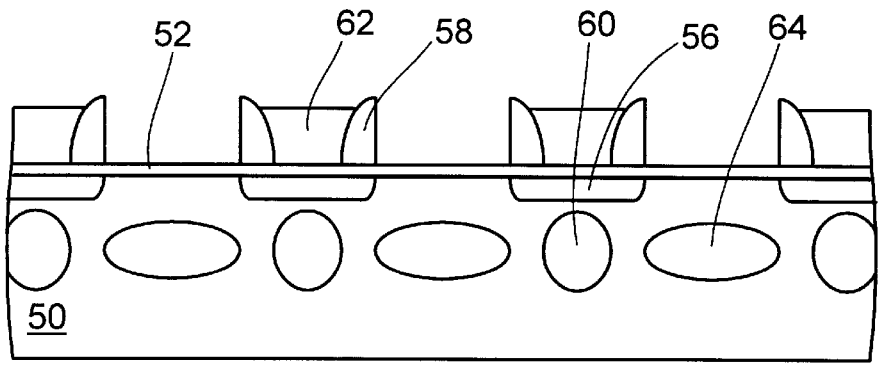

Next, a mask is formed to define an antipunchthrough implantation that is spaced away from the more heavily doped second portions 60 of the buried bit lines. Referring now to FIG. 5, another layer of material different from the main bit line mask 54 is provided over the spacers 58 and the main bit line mask 54. An appropriate layer might consist of CVD oxide deposited to a depth of approximately 1000–2000 Å. The layer of oxide is planarized using a chemical mechanical polishing (CMP) or an etch back process to form the oxide plugs 62 filling the separations between the spacers 58 and having upper surfaces at approximately the upper edge of the spacers 58. To facilitate the planarization process, it is preferred that the plugs be formed from oxide because it is readily compatible with either planarization strategy. Main bit line mask 54 is removed, preferably using a heated phosphoric acid solution to remove the preferred silicon nitride main bit line mask material. Selection of oxide or polysilicon for the plugs 62 facilitates the preferred wet etching process. The resulting structure, shown in FIG. 6, is appropriate to serve as a mask for an antipunchthrough implantation process. Antipunchthrough implantations are then made through the openings in the antipunchthrough mask. Most preferably, the antipunchthrough implantations 64 are made to a depth approximately equal to the depth at which the second portions of the buried bit lines are formed. An appropriate antipunchthrough implantation might, for example, consist of implantation of boron ions at an energy of 150 KeV to a dosage of approximately $5 \times 10^{12}/cm^2$, self aligned to the antipunchthrough mask shown in FIG. 6. The various oxide plugs 62, the spacers 58 and the pad oxide layers are then stripped. If the spacers are oxide, then the stripping process may be accomplished by dipping the FIG. 6 in a dilute solution of HF.

Figure 7:
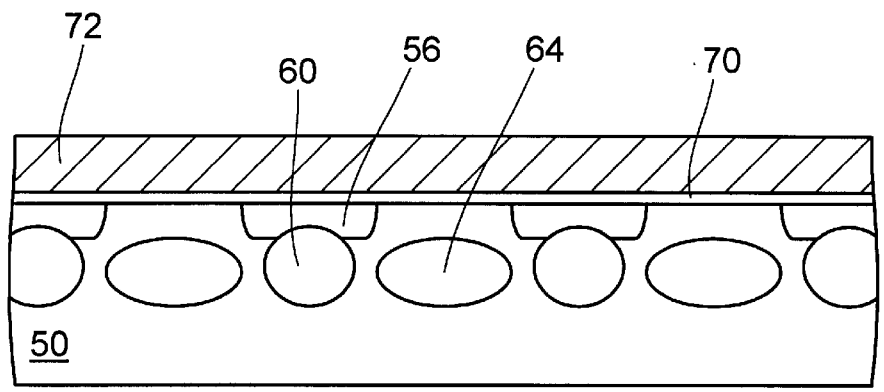
Figure 8:
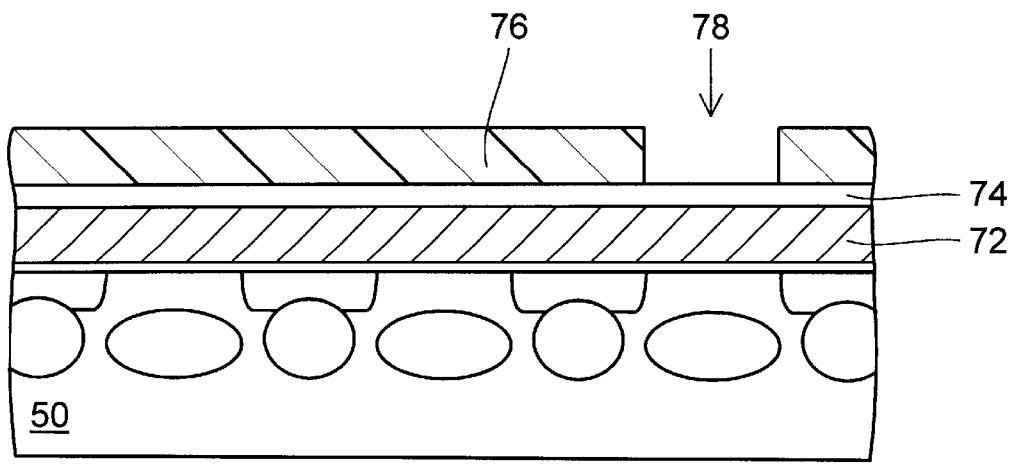
Figure 9:
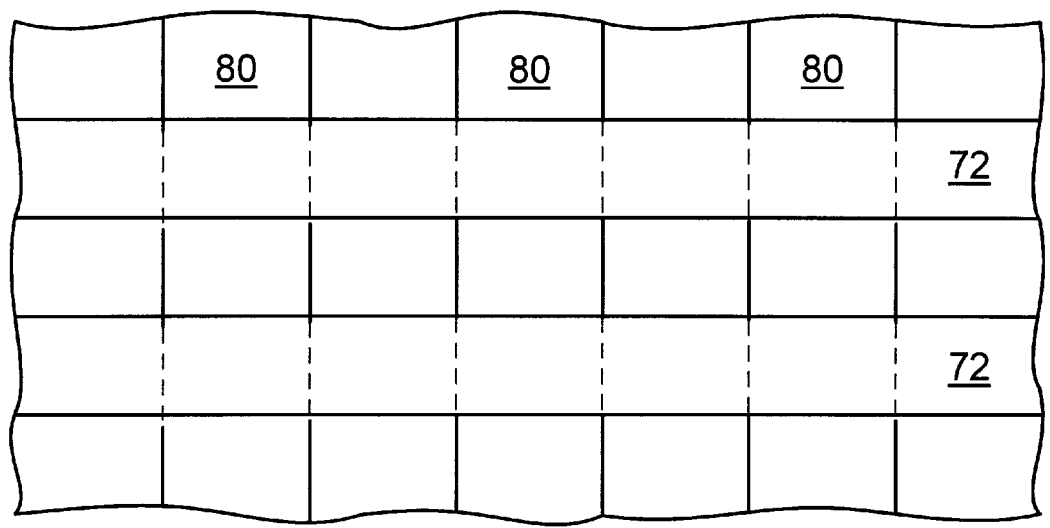
FIG. 9 is a plan view of the mask ROM of FIG. 7.

Further processing is performed to complete formation of the buried bit line structure and the illustrated mask ROM. Referring now to FIG. 7, a gate oxide layer 70 is formed over the cleaned surface of the substrate 50. The oxide layer formed has a far more uniform thickness than occurs in the conventional process flow because the FIG. 7 substrate does not have the high level of N-type dopant present on the surface of the substrate that produces the oxide structure of FIG. 2. Most preferably, the annealing process needed to complete the buried bit lines and the antipunchthrough implantation is accomplished during the growth of the gate oxide layer 70. Subsequently, a layer of polysilicon is deposited over the surface of the gate oxide layer 70 and the polysilicon layer is doped, preferably by doping in situ during deposition, and then the polysilicon layer is patterned to define gate electrodes 72. The polysilicon gate electrodes are then covered by a layer 74 (FIG. 8) of passivating and insulating material. When the ROM is needed, a code mask 76 is provided having openings 78 over the channel regions of the memory FETs and the memory array is programmed by implanting impurities such as boron to selectively alter the threshold voltage of the memory FETs. FIG. 9 shows a plan view of the completed ROM, with an array of gate electrodes 72 extending across the array of buried bit lines 80.

The present invention has been described with particular emphasis on certain preferred embodiments. Those of ordinary skill in the art will appreciate that various modifications and alterations can be made to the present invention without altering the fundamental teachings of the invention. As such, the scope of the present invention is not to be limited to the particular preferred embodiments described herein, but is instead to be determined from the scope of the claims, which follow.

What is claimed:

1. A method of forming a memory device comprising the steps of:

providing a substrate having a surface doping of a first conductivity type;

forming an array of buried bit lines in the substrate, the buried bit lines having a doping of a second conductivity type, the buried bit lines having a vertically graded dopant distribution, surface portions of the buried bit lines being more lightly doped than deeper portions of the buried bit lines, the surface portions of the buried bit lines defining channel regions therebetween;

providing an antipunchthrough implantation of the first conductivity type buried below the channel regions and spaced from the deeper portions of the buried bit lines;

forming a gate oxide layer on the substrate and the buried bit lines; and providing an array of work lines extending over the gate oxide layer and generally perpendicular to the array of buried bit lines.

2. The method of claim 1, further comprising the step of providing an antipunchthrough implantation of the first conductivity type buried below the channel regions and spaced from the deeper portions of the buried bit lines.

3. The method of claim 2, wherein the memory device comprises an array of memory transistors including adjacent buried bit lines as source/drain regions and portions of word lines as gate electrodes, the method further comprising the step of selectively altering the threshold voltage of selected ones of the memory transistors to provide non-volatile programming of the memory device.

4. The method of claim 3, wherein the step of selectively altering the threshold voltage consists of implanting impurities of the first type into the channel regions of the selected ones of the memory transistors.

5. A method of forming a memory device comprising the steps of:

providing a substrate having a surface doping of a first conductivity type;

providing a main bit line mask over the substrate, the main bit line mask having main bit line openings implanting a first dosage of impurities of a second conductivity type into the main bit line openings to a first implantation depth to form first portions of an array of buried bit lines, the first portions of the buried bit lines defining channel regions therebetween;

providing a narrow bit line mask over the substrate, the narrow bit line mask having narrow openings smaller in width than the main bit line openings;

implanting a second dosage of impurities of a second conductivity type into the narrow openings to a second implantation depth to form second portions of the array of buried bit lines, the second dosage being greater than the first dosage and the second implantation depth being greater than the first implantation depth;

after said implanting a first dosage and said implanting a second dosage, removing the narrow bit line mask and the main bit line mask to expose a flat surface over the substrate having buried bit lines;

after said removing, forming a uniform gate oxide layer on the exposed flat surface to provide a flat gate layer over the substrate; and providing an array of word lines extending over the gate oxide layer and generally perpendicular to the array of buried bit lines.

6. The method of claim 5, wherein the narrow bit line mask is defined by depositing a layer of spacer material different from a main bit line mask material over the main bit line mask and etching back the spacer material to form spacers with the main bit line openings, separations between the spacers defining the narrow openings.

7. The method of claim 6, further comprising the step of providing an antipunchthrough implantation of the first conductivity type buried below the channel regions and spaced from the second portions of the buried bit lines.

8. The method of claim 7, wherein the antipunchthrough implantation is providing using the steps of:

filling the narrow openings with an antipunchthrough mask material different from the main bit line mask material;

removing the main bit line mask, leaving the spacers over the substrate; and implanting antipunchthrough dopants self-aligned to the spacers.

9. The method of claim 6, wherein the spacers comprise polysilicon or an oxide and the main bit line material comprises a nitride.

10. The method of claim 8, wherein the antipunchthrough mask material comprises an oxide and the main bit line mask material comprises a nitride.

11. The method of claim 10, wherein the main bit line mask is removed using a phosphoric acid dip.

12. The method of claim 6, wherein the memory device comprises an array of memory transistors including adjacent buried bit lines as source/drain regions and portions of word lines as gate electrodes, the method further comprising the step of selectively altering the threshold voltage of selected ones of the memory transistors to provide non-volatile programming of the memory device.

13. The method of claim 12, wherein the step of selectively altering the threshold voltage consists of implanting impurities of the first type into the channel regions of the selected ones of the memory transistors.

14. A method of forming a memory device comprising the steps of:

providing a substrate having a surface doping of a first conductivity type;

providing a first bit line mask over the substrate, the main bit line mask having first bit line openings;

implanting a first dosage of impurities of a second conductivity type into the first bit line openings to a first implantation depth to form first portions of an array of buried bit lines, the first portions of the buried bit lines defining channel regions therebetween;

providing a second bit line mask over the substrate, the second bit line mask having second openings;

implanting a second dosage of impurities of the second conductivity type into the second openings to a second implantation depth to form second portions of the array of buried bit lines, the second dosage being greater than the first dosage and the second implantation depth being greater than the first implantation depth;

forming an antipunchthrough implantation mask having antipunchthrough openings, edges of the antipunchthrough mask lying over portions of the substrate covered by the second bit line mask at a different step of the method;

providing an antipunchthrough implantation of the first conductivity type buried below the channel regions and spaced from the second portions of the buried bit lines;

forming a gate oxide layer over the substrate; and providing an array of word lines extending over the gate oxide layer and generally perpendicular to the array of buried bit lines.

15. The method of claim 14, wherein the second bit line mask is defined by depositing a layer of spacer material different from a first bit line mask material over the first bit line mask and etching back the spacer material to form spacers with the first bit line openings, separations between the spacers defining the second openings.

16. The method of claim 14, wherein the memory device comprises an array of memory transistors including adjacent buried bit lines as source/drain regions and portions of word lines as gate electrodes, the method further comprising the step of selectively altering the threshold voltage of selected ones of the memory transistors to provide non-volatile programming of the memory device.

17. The method of claim 16, wherein the step of selectively altering the threshold voltage consists of implanting impurities of the first type into the channel regions of the selected ones of the memory transistors.

18. The method claim 14, wherein the first dosage is at least approximately ten times smaller than the second dosage.

19. The method of claim 5, further comprising the step of providing an antipunchthrough implantation of the first conductivity type buried below the channel regions and spaced from the second portions of the buried bit lines.

20. The method of claim 5, wherein said steps of implanting first and second dosages form the first and second portions of the buried bit lines such that each of the second portions have a width narrower than a width of each of the first portions.

21. The method of claim 1, wherein said step of forming an array of buried bit lines includes forming the bit lines with first and second portions, the second portions being more heavily doped than the first portions, being disposed directly below the first portions and having a width narrower than a width of the first portions.

22. A method of forming a memory device comprising the steps of:

providing a substrate having a surface doping of a first conductivity type;

providing a main bit line mask over the substrate, the main bit line mask having main bit line openings;

implanting a first dosage of impurities of a second conductivity type into the main bit line openings to a first implantation depth to form first portions of an array of buried bit lines, the first portions of the buried bit lines defining channel regions therebetween;

providing a narrow bit line mask over the substrate, the narrow bit line mask having narrow openings smaller in width than the main bit line openings;

implanting a second dosage of impurities of a second conductivity type into the narrow openings to a second implantation depth to form second portions of the array of buried bit lines, the second dosage being greater than the first dosage and the second implantation depth being greater than the first implantation depth;

providing an antipunchthrough implantation of the first conductivity type buried below the channel regions and spaced from the second portions of the buried bit lines;

forming a gate oxide layer over the substrate; and providing an array of word lines extending over the gate oxide layer and generally perpendicular to the array of buried bit lines.

* * * * *